United States Patent
Kim et al.

(10) Patent No.: US 9,748,452 B2
(45) Date of Patent: Aug. 29, 2017

(54) LIGHT-EMITTING ELEMENT PACKAGE

(71) Applicant: LG INNOTEK CO., LTD., Seoul (KR)

(72) Inventors: Muyng Gi Kim, Seoul (KR); Hui Seong Kang, Seoul (KR); Yeong June Lee, Seoul (KR); Bong Kul Min, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/123,097

(22) PCT Filed: Feb. 3, 2015

(86) PCT No.: PCT/KR2015/001090
§ 371 (c)(1),
(2) Date: Sep. 1, 2016

(87) PCT Pub. No.: WO2015/137623
PCT Pub. Date: Sep. 17, 2015

(65) Prior Publication Data
US 2017/0069806 A1    Mar. 9, 2017

(30) Foreign Application Priority Data
Mar. 13, 2014 (KR) .......................... 10-2014-0029429

(51) Int. Cl.
*H01L 33/54* (2010.01)
*H01L 33/58* (2010.01)
(Continued)

(52) U.S. Cl.
CPC .......... *H01L 33/58* (2013.01); *H01L 23/3121* (2013.01); *H01L 33/486* (2013.01);
(Continued)

(58) Field of Classification Search
None
See application file for complete search history.

(56) References Cited

U.S. PATENT DOCUMENTS

2006/0105484 A1    5/2006  Basin et al.
2008/0023714 A1*   1/2008  Chae ................... H01L 33/507
                                                          257/98

FOREIGN PATENT DOCUMENTS

JP    2012-023184     2/2012
KR    10-2007-0121423  12/2007
(Continued)

OTHER PUBLICATIONS

International Search Report dated May 22, 2015 issued in Application No. PCT/KR2015/001090 (Original Search Report with English Translation).

*Primary Examiner* — Cheung Lee
(74) *Attorney, Agent, or Firm* — KED & Associates, LLP

(57) ABSTRACT

One embodiment comprises: a body having a cavity which includes a bottom and sides; a light-emitting element arranged within the cavity of the body; a molding part arranged within the cavity so as to seal the light-emitting element; and a lens which includes a light incident surface and a light emitting surface and is arranged on the molding part, wherein the diameter of the light incident surface of the lens is smaller than a maximum diameter of the cavity, and the height of the lens is lower than the diameter of the light incident surface of the lens.

20 Claims, 19 Drawing Sheets

(51) Int. Cl.
*H01L 23/31* (2006.01)
*H01L 33/48* (2010.01)
*H01L 33/62* (2010.01)

(52) U.S. Cl.
CPC .............. *H01L 33/54* (2013.01); *H01L 33/62* (2013.01); *H01L 2224/48091* (2013.01); *H01L 2224/48247* (2013.01); *H01L 2224/48257* (2013.01); *H01L 2924/181* (2013.01)

(56) References Cited

FOREIGN PATENT DOCUMENTS

KR   10-2008-0010535   1/2008
KR   10-2013-0098886   9/2013

* cited by examiner

FIG.15

| h : 0mm | | | Cavity Depth : $t_2$ [mm] | | | | |
|---|---|---|---|---|---|---|---|
| | | | $t_2 = 0.3$ | $t_2 = 0.35$ | $t_2 = 0.4$ | $t_2 = 0.45$ | $t_2 = 0.5$ |
| Lens Sphere Radius : r [mm] | r = 1.3 | Po[mW] | 383.00 | 378.01 | 372.07 | 365.36 | 357.62 |
| | | Orientation angle [°] | 112.3 | 107.2 | 102.7 | 97.1 | 92.3 |
| | r = 1.35 | Po[mW] | 382.36 | 377.49 | 371.70 | 365.15 | 357.63 |
| | | Orientation angle [°] | 112.1 | 107.4 | 103.3 | 97.5 | 93.1 |
| | r = 1.4 | Po[mW] | 381.71 | 376.96 | 371.29 | 364.88 | 357.51 |
| | | Orientation angle [°] | 112.5 | 107.6 | 103.4 | 98.2 | 93.6 |

FIG. 16

| $t_2$ : 0.5mm | | | Lens Height : h [mm] | | | | |
|---|---|---|---|---|---|---|---|
| | | | 0.2 | 0.4 | 0.6 | 0.8 | 1.0 |
| Lens Sphere Radius: r [mm] | r = 1.3 | Po[mW] | 352.41 | 339.45 | 326.97 | 314.73 | 303.98 |
| | | Orientation angle [°] | 78.6 | 69.0 | 63.9 | 56.7 | 49.2 |
| | r = 1.35 | Po[mW] | 354.68 | 343.29 | 330.78 | 318.31 | 306.80 |
| | | Orientation angle [°] | 79.9 | 67.3 | 62.7 | 56.4 | 49.2 |
| | r = 1.4 | Po[mW] | 355.99 | 346.88 | 334.32 | 314.89 | 313.23 |
| | | Orientation angle [°] | 80.9 | 66.8 | 61.3 | 51.2 | 50.8 |

FIG.17

| Cannonball-shaped lens Lens h/(Lens H)[mm] | | | 0.8 / (2.1) | 1.0 / (2.3) | 1.3 / (2.6) | 1.7 / (3.0) | 2.0 / (3.3) |
|---|---|---|---|---|---|---|---|
| Cavity Depth $t_2$ [mm] | $t_2 = 0.4$ | Po[mW] | 354.6 | 339.4 | 323.9 | 312.3 | 308.9 |
| | | Orientation angle [°] | 66.3 | 59.2 | 49.2 Side beam | 39.1 | 34.9 |
| | $t_2 = 0.5$ | Po[mW] | 341.6 | 329.6 | 315.7 | 306.1 | 301.3 |
| | | Orientation angle [°] | 63.4 | 56.5 | 45.2 Side beam | 37.8 | 34.1 |
| Elliptical lens Lens b [mm] | | | 2.2 | 2.4 | 2.6 | 2.8 | 3.0 |
| Cavity Depth $t_2$ [mm] | $t_2 = 0.4$ | Po[mW] | 377.0 | 373.9 | 370.9 | 368.2 | 365.8 |
| | | Orientation angle [°] | 62.8 | 58.1 | 53.6 Side beam | 49.5 | 46.5 |
| | $t_2 = 0.5$ | Po[mW] | 368.0 | 364.9 | 362.0 | 359.4 | 357.0 |
| | | Orientation angle [°] | 60.2 | 55.8 | 51.2 Side beam | 48.1 | 44.3 |

LIGHT-EMITTING ELEMENT PACKAGE

CROSS-REFERENCE TO RELATED PATENT APPLICATIONS

This application is a U.S. National Stage Application under 35 U.S.C. §371 of PCT Application No. PCT/PCT/KR2015/001090, filed Feb. 3, 2015, which claims priority to Korean Patent Application No. 10-2014-0029429, filed Mar. 13, 2014, whose entire disclosures are hereby incorporated by reference.

TECHNICAL FIELD

Embodiments relate to a light emitting element package.

BACKGROUND ART

Light emitting elements, such as light emitting diodes (LED) or laser diodes (LD), which use group III-V or II-VI compound semiconductor materials, are capable of emitting visible light of various colors, such as red, green and blue, and ultraviolet light owing to development of element materials and thin film growth techniques, are also capable of emitting white light with high luminous efficacy through use of a fluorescent substance or by combining colors, and have several advantages, namely low power consumption, semi-permanent lifespan, fast response speed, safety, and environmental friendliness, as compared to conventional light sources, such as fluorescent lamps and incandescent lamps.

Accordingly, application of the light emitting elements has been extended to transmission modules of optical communication means, light emitting diode backlights to replace Cold Cathode Fluorescent Lamps (CCFL) which serve as backlights of Liquid Crystal Display (LCD) apparatuses, white light emitting diode lighting apparatuses to replace fluorescent lamps or incandescent lamps, vehicle head lamps, and traffic lights.

Light emitting element packages are widely used in lighting apparatuses or display apparatuses. A light emitting element package may generally include a body, lead frames located within the body, and a light emitting element (for example, an LED) located on any one of the lead frames.

DISCLOSURE

Technical Problem

Embodiments provide a light emitting element package which may omit side beams and implement a narrow orientation angle.

Technical Solution

In one embodiment, a light emitting element package includes a body having a cavity including a bottom and a side surface, a light emitting element disposed in the cavity of the body, a molding part disposed in the cavity so as to seal the light emitting element, and a lens including a light incident surface and a light emitting surface and disposed on the molding part, wherein a diameter of the light incident surface of the lens is less than the maximum diameter of the cavity, and a height of the lens is less than the diameter of the light incident surface of the lens.

A staircase part having a height difference with an upper surface of the body and being parallel to the upper surface of the body may be disposed at an upper end of the side surface of the cavity, and an edge of the light incident surface of the lens may contact the staircase part.

The cavity may include a first region located under the staircase part and a second region located on the staircase part, and the diameter of the light incident surface of the lens may be less than a diameter of the second region of the cavity and be greater than a diameter of the first region of the cavity.

The diameter of the second region of the cavity may be greater than the maximum diameter of the first region of the cavity.

A separation distance between the side surface of the second region of the cavity and a boundary line between the edge of the light incident surface and the lowermost end of the light emitting surface of the lens may be greater than the height difference.

A boundary line between the edge of the light incident surface and the lowermost end of the light emitting surface of the lens may contact the staircase part and overlap with the staircase part in a vertical direction.

The molding part may include a first part disposed in the first region of the cavity and provided with an upper surface contacting the light incident surface of the lens, and a second part disposed between a lower end of the light emitting surface of the lens and the side surface of the cavity located in the second region of the cavity.

The second part of the molding part respectively may contact the lower end of the light emitting surface of the lens and the side surface of the cavity located in the second region of the cavity.

An upper surface of the second part of the molding part may be located below the upper surface of the body.

The lens may include a first part having a hemispherical shape and a second part located under the first part and having a cylindrical shape with the same radius as the first part, a lower surface of the second part may correspond to the light incident surface of the lens, and an outer circumferential surface of the first part and an outer circumferential surface of the second part may correspond to the light emitting surface of the lens. A diameter of the lens may be greater than the height of the lens, the diameter of the lens may be the diameter of the light incident surface of the lens, and the height of the lens may be a distance from the light incident surface of the lens to the highest point of the light emitting surface of the lens.

A cross-section of the lens passing by a center of the light incident surface of the lens and being vertical to the light incident surface may have a semi-elliptic shape. A diameter of the lens may be greater than the height of the lens, the diameter of the lens may be the diameter of the light incident surface of the lens, and the height of the lens may be a distance from the light incident surface of the lens to the highest point of the light emitting surface of the lens.

In another embodiment, a light emitting element package includes a body having a cavity including a bottom and a side surface, a light emitting element disposed in the cavity of the body, a molding part configured to seal the light emitting element, and a lens including a light incident surface and a light emitting surface and disposed on the molding part, wherein a diameter of the light incident surface of the lens is less than the maximum diameter of the cavity, the height of the lens is less than the diameter of the light incident surface of the lens, the molding part includes a first molding part filling the cavity to seal the light emitting element and a second molding part disposed on the first molding part, and the lens is disposed on the second molding part and the light incident surface of the lens contacts the second molding part.

An upper surface of the second molding part may be located higher than the upper surface of the body.

In yet another embodiment, a light emitting element package includes a body having a cavity including a bottom and a side surface, a light emitting element disposed in the cavity of the body, a molding part configured to seal the light emitting element, and a lens including a light incident surface and a light emitting surface and disposed on the molding part, wherein a diameter of the light incident surface of the lens is less than the maximum diameter of the cavity, a height of the lens is less than the diameter of the light incident surface of the lens, the light incident surface of the lens is a convex surface, and an interface between the light incident surface of the lens and the molding part is a concave surface.

An upper surface of the molding part may be a concave surface contacting the light incident surface of the lens.

The upper end of the edge of the molding part may be located higher than the upper surface of the body and the light incident surface of the lens.

An upper end of an edge of the molding part may be located higher than a central portion of the light incident surface of the lens.

An upper end of an edge of the molding part may protrude to a gap between the side surface of the cavity and a lower end of the light emitting surface of the lens.

Advantageous Effects

Embodiments provide a light emitting element package which may omit side beams and implement a narrow orientation angle.

DESCRIPTION OF DRAWINGS

FIG. 15 is a table showing orientation angle characteristics of the light emitting element package of the third embodiment according to change of the depth of a cavity.

FIG. 16 is a table showing orientation angle characteristics of the light emitting element package of the third embodiment according to change of the diameter of a lens.

FIG. 17 is a table showing change of orientation angles and side beams according to the heights of lenses of the third embodiment and the sixth embodiment.

BEST MODE

Figure 1:
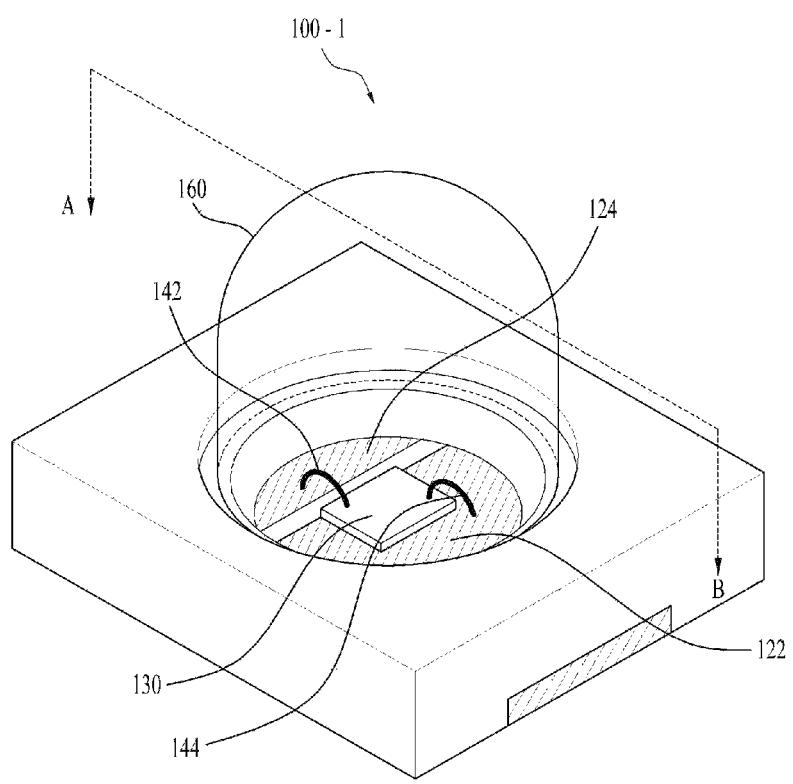
FIG. 1 is a perspective view of a light emitting element package in accordance with a first embodiment.

Hereinafter, embodiments will be apparently described with reference to the annexed drawings and description. In the following description of the embodiments, it will be understood that, when each layer (film), region, pattern or structure is referred to as being formed "on" or "under" a substrate, another layer (film), region, pad or pattern, it can be directly "on" or "under" the other element or be indirectly formed with one or more intervening elements therebetween. In addition, it will also be understood that "on" or "under" the element may be described based on the drawings.

In the drawings, the sizes of respective elements may be exaggerated, omitted, or schematically illustrated for convenience and clarity of description. Further, the sizes of the respective elements do not indicate actual sizes thereof. Additionally, the same or similar elements are denoted by the same reference numerals even though they are depicted in different drawings. Hereinafter, light emitting element packages in accordance with embodiments will be described with reference to the accompanying drawings.

Figure 2:
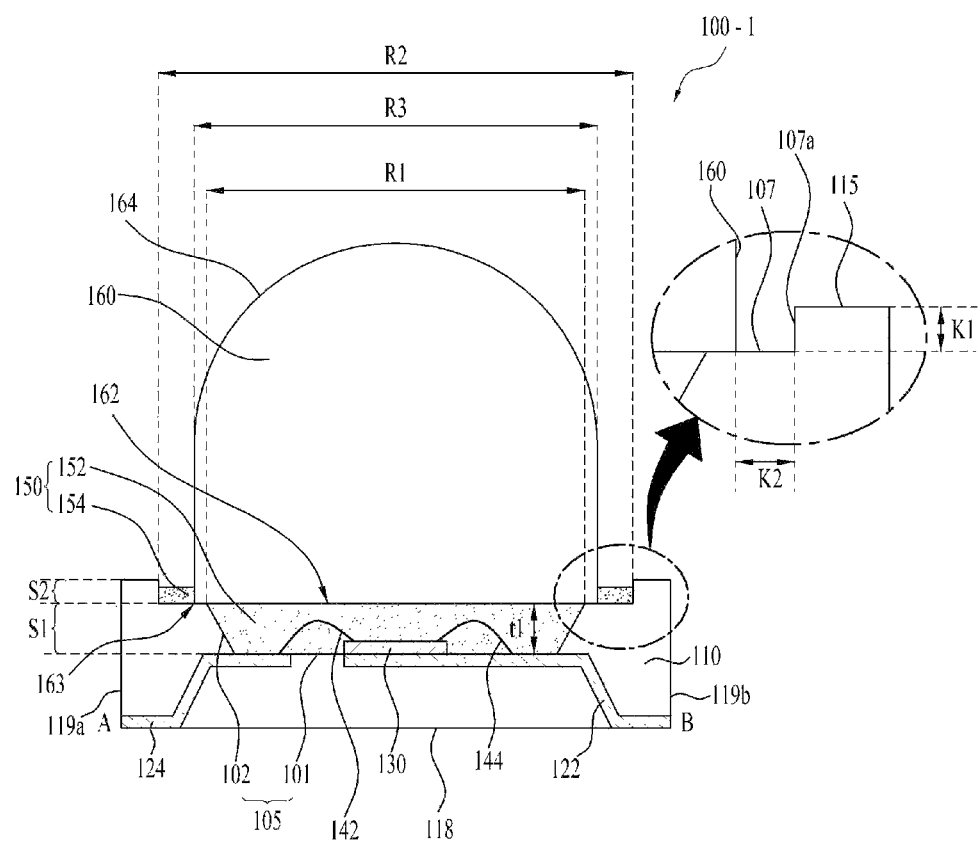
FIG. 2 is a cross-sectional view taken along line A-B of the light emitting element package shown in FIG. 1.

FIG. 1 is a perspective view of a light emitting element package 100-1 in accordance with a first embodiment, FIG. 2 is a cross-sectional view taken along line A-B of the light emitting element package 100-1 shown in FIG. 1.

With reference to FIGS. 1 and 2, the light emitting element package 100-1 includes a body 110, a first lead frame 122, a second lead frame 124, a light emitting element 130, wires 142, 144, a molding part 150, and a lens 160.

The body 110 may be formed of at least one of a resin, such as Polyphthalamide (PPA), silicon (Si), a metal, photo sensitive glass (PSG), sapphire ($Al_2O_3$), and a printed circuit board (PCB).

Further, the body 110 may be formed of a conductive material. If the body 110 is formed of a conductive material, an insulating film (not shown) may be formed on the surface of the body 110 so as to prevent the body 110 from electrically short-circuiting the first lead frame 122 and the second lead frame 124.

The body 110 may have various shapes, such as a triangular shape, a rectangular shape, a polygonal shape, a circular shape, etc., as seen from the top, according to the purpose and design of the light emitting element 130.

The upper surface of the body 110 may be opened, and the body 110 may have a cavity 105 including a bottom 101 and a side surface 102. The cavity 105 may be formed in a cup shape, a concave container shape, etc., and the side surface 102 of the cavity 105 may be vertical to or inclined to the bottom 101.

Although the cavity 105 shown in FIG. 1 may have a circular shape, as seen from the top, the disclosure is not limited thereto and, in another embodiment, the cavity 105 may have a polygonal shape (for example, a rectangular shape) or an elliptical shape.

The upper end of the side surface 102 of the cavity 105 may be bent or curved. A staircase part 107 having a height difference K1 with an upper surface 115 of the body 110 and being parallel to the upper surface 115 of the body 110 may be formed at the upper end of the side surface 102 of the cavity 105, and a staircase surface 107a may be located between the upper surface 115 of the body 110 and the staircase part 107. Although FIG. 2 illustrates the staircase surface 107a as being vertical to the staircase part 107, the disclosure is not limited thereto and, in another embodiment, an angle formed therebetween may be an obtuse angle.

A distance K2 from the outer circumferential surface of the lens 160 located on the staircase part 107 to the staircase surface 107a may be greater than the height difference K1 between the upper surface 115 of the cavity 105 and the staircase part 107. If the distance K2 from the outer circumferential surface of the lens 160 located on the staircase part 107 to the staircase surface 107a is less than or equal to the height difference K1, bubbles may be formed in the molding part 150, which will be described later.

The cavity 105 may include a first region S1 located under the staircase part 107 and a second region S2 located on the staircase part 107. The diameter R2 of the second region S2 may be greater than the maximum diameter R1 of the first region S1 (R2>R1). For example, the maximum diameter of the first region S1 may be the diameter of the uppermost end of the first region S1.

The depth t1 of the first region S1 of the cavity 105 may be 100 µm~5 mm.

If the depth t1 of the first region S1 of the cavity 105 is less than 100 µm, the wires 142, 144 may be exposed to the outside of the molding part 150 and thus contact a light incident surface 162 of the lens 160 and, if the light emitting element 130 is a flip-chip type, the light emitting element may be pressed.

Further, if the depth t1 of the first region S1 of the cavity 105 exceeds 5 mm, a large amount of a resin fills the first region S1 of the cavity 105 and, when the lens 160 is attached to the resin, a movement amount of the resin is increased, a movement path of the resin is increased and thus a large amount of bubbles may be formed in the molding layer 150.

The first lead frame 122 and the second lead frame 124 are disposed in the body 110 such that they are spaced so as to be conductibly separated from each other. For example, the first lead frame 122 and the second lead frame 124 may be disposed in the body 110 under the bottom 101 of the cavity 105 so as to be separated from each other.

A part of the first lead frame 122 and the second lead frame 124 may be exposed through the cavity 105. For example, the upper surfaces of the first lead frame 122 and the second lead frame 124 may be exposed through the cavity 105.

The first lead frame 122 and the second lead frame 124 may be exposed to the outside via the body 110.

For example, one end of the first lead frame 122 may be exposed to the outside through a lower surface 118 and a second side surface 119b of the body 110, and one end of the second lead frame 124 may be exposed to the outside through the lower surface 118 and a first side surface 119a of the body 110. The first side surface 119a and the second side surface 119b may be side surfaces opposite to each other, but the disclosure is not limited thereto.

The first lead frame 122 and the second lead frame 124 may be formed of a conductive material, such as a metal, for example, formed of at least one of titanium (Ti), copper (Cu), nickel (Ni), gold (Au), chrome (Cr), tantalum (Ta), platinum (Pt), tin (Sn), silver (Ag) and phosphorous (P), or an alloy thereof, and have a single layer structure or a multilayer structure.

A separate reflective member (not shown) may be additionally disposed on the first lead frame 122 and the second lead frame 124 and thus reflect light emitted from the light emitting element 130 so as to improve luminous efficacy, but the disclosure is not limited thereto.

The light emitting element 130 is disposed within the cavity 105 of the body 110. The light emitting element 130 may be conductibly connected to the first lead frame 122 and the second lead frame 124. For example, the light emitting element 130 may be disposed on the first lead frame 122 exposed by the cavity 105.

For example, the light emitting element 130 may be a chip-type light emitting diode (LED) and be bonded to the upper surface of the first lead frame 122 by die bonding. Die bonding may include paste bonding in which a chip is bonded to a substrate using an adhesive (for example, an Ag paste or silicone), eutectic bonding in which metal (for example Au/Sn) is applied to a chip pad and the chip pad is bonded to a substrate using the metal (for example Au/Sn) at a high temperature, and flip chip bonding in which a chip pad and a substrate are directly connected using solder.

The wires 142, 144 conductibly connect the light emitting element 130 to the first lead frame 122 and the second lead frame 124. In another embodiment, the light emitting element 130 may be conductibly connected to the first lead frame 122 and the second lead frame 124 through die bonding, such as paste bonding, flip chip bonding and eutectic bonding.

The molding part 150 is disposed within the cavity 105 so as to seal and protect the light emitting element 130 and the wires 142, 144. For example, the molding part 160 may be formed of a resin, such as epoxy or silicone, and be formed by filling the inside of the cavity 105 with the resin using a method, such as dispensing.

The lens 160 is disposed on the molding part 150 and refracts light passing through the molding part 150. The lens 160 may include a light incident surface 162 upon which light having passed through the molding part 150 is incident, and a light emitting surface 164 which refracts and emits light having passed through the light incident surface 162.

The light incident surface 162 of the lens 160 may be flat, and the light emitting surface 164 of the lens 160 may be a convex surface. However, the shapes of the light incident surface 162 and the light emitting surface 164 of the lens 160 are not limited thereto and parts thereof may have a concave or convex shape.

The diameter R3 of the light incident surface 162 of the lens 160 is less than the maximum diameter of the cavity 105.

For example, the diameter R3 of the light incident surface 162 of the lens 160 may be less than the diameter of the uppermost end of the cavity 105.

For example, the diameter R3 of the light incident surface 162 of the lens 160 may be less than the diameter R2 of the second region S2 of the cavity 105 and be greater than the diameter R1 of the first region S1 of the cavity 105 (R1<R3<R2).

The light emitting surface 164 of the lens 160 may be spaced from the side surface 102 of the second region S2 of the cavity 105. A separation distance between the side surface 102 of the second region S2 of the cavity and a boundary line 163 between the edge of the light incident surface 162 and the lowermost end of the light emitting surface 164 of the lens 160 may be greater than the height difference K1 (K2>K1), as described above.

The inside of the cavity 105 is filled with the molding part 150 formed of a resin (for example, silicone), the lens 160 is disposed on the molding part 150 before the molding part 150 is hardened, and the molding part 150 is hardened after disposition of the lens 160, thereby being capable of bonding the lens 160 to the molding part 150.

In general, if the diameter of the lens 160 is greater than the diameter of the cavity of the body, when the lens is attached to the resin, air in the cavity of the body does not escape and thus a large amount of bubbles may be formed in the molding part.

However, in the embodiment, the diameter R3 of the light incident surface 162 of the lens 160 is less than the diameter R2 of the second region S2 of the cavity 105 and, thus, formation of bubbles in the molding part 160 may be suppressed when the lens 160 is attached to the molding part 160.

Further, since the diameter R3 of the light incident surface 162 of the lens 160 is less than the diameter R2 of the second region S2 of the cavity 105, the embodiment may implement a narrow orientation angle.

In general, when a lens is disposed on a resin prior to hardening, the lens may submerge, the surface of the resin may become concave due to wettability and surface tension of the resin, and the resin may climb along the side surface of the cavity. Since the thickness of the molding part varies according to positions due to the concave surface of the resin, color uniformity may be lowered.

However, in the embodiment, since the diameter R3 of the light incident surface 162 of the lens 160 is less than the diameter R2 of the second region S2 of the cavity 105 and is greater than the diameter R1 of the first region S1 of the cavity 105 (R1<R3<R2), the light incident surface 162 of the lens 160 may be located below the upper surface 115 of the body 110, and the edge of the light incident surface 162 of the lens 16 may contact the staircase part 107 and be supported by the staircase part 107. Further, the light emitting surface 164 of the lens 160 may be spaced from the side surface 102 of the second region S2 of the cavity 105, and the light incident surface 162 of the lens 160 may contact the upper surface of the molding part 150.

Since the edge of the light incident surface 162 of the lens 160 is supported by the staircase part 107 in such a manner, the upper surface of the molding part 10 may be parallel to the staircase part 107 and coplanar with the staircase part 107. For example, the height from the upper surface of the first lead frame 122 to the upper surface of the molding part 150 may be equal to the height from the upper surface of the first lead frame 122 to the staircase part 107.

Further, the boundary line 163 between the edge of the light incident surface 162 of the lens 160 and the lowermost end of the light emitting surface 164 may contact the staircase part 170 and overlap with the staircase part 170 in the vertical direction. Here, the vertical direction may be a direction from the upper surface of the first lead frame 122 to the upper surface of the molding part 150.

In the embodiment, the staircase part 107 may prevent formation of the concave upper surface of the molding part 150, thus preventing lowering of color uniformity.

Although the light incident surface 162 of the lens is supported by the staircase part 107, a part of the resin prior to hardening may ascend to a region between the lower end of the light emitting surface 164 of the lens 160 and the side surface of the second region S2 of the cavity 105.

The molding part 150 may include a first part 152 disposed in the first region 51 of the cavity and provided with an upper surface contacting the light incident surface 162 of the lens, and a second part 154 disposed between the lower end of the light emitting surface 162 of the lens 160 and the side surface 102 of the cavity 105 located in the second region S2 of the cavity 105. The second part 154 may contact the lower end of the light emitting surface 162 of the lens 160 and the side surface 102 of the cavity 105 located in the second region S2 of the cavity 105, and the upper surface of the second part 154 of the molding part 15 may be located below the upper surface 115 of the body 110. For example, the height of the upper surface of the second part 154 of the molding part 15 may be lower than the height of the upper surface 115 of the body 110 based on the staircase part 107.

The molding part 150 may be formed of a colorless and transparent polymer resin, for example, epoxy or silicone. The molding part 150 may include a phosphor to convert the wavelength of light emitted from the light emitting element 130. Further, the molding part 150 may include a light diffuser to diffuse light.

Figure 3:
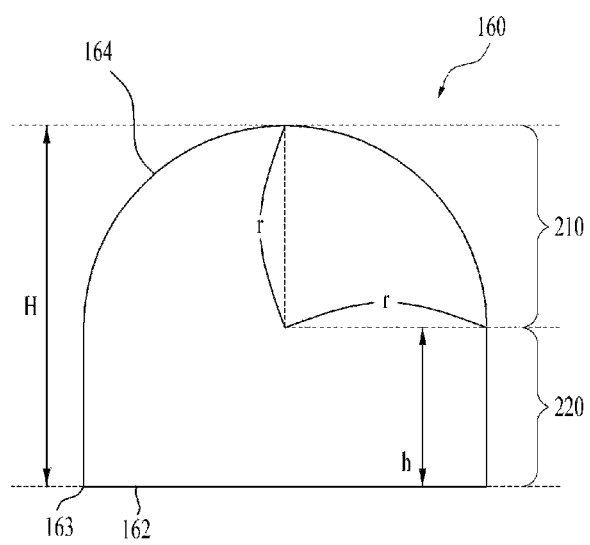
FIG. 3 is a cross-sectional view of a lens shown in FIG. 1.

FIG. 3 is a cross-sectional lens 130 shown in FIG. 1.

With reference to FIG. 3, the lens 160 may include a first part 210 having a hemispherical shape with a predetermined radius r and a second part 220 having a cylindrical shape with the same radius r as the first part 210. For example, the overall shape of the lens 160 may be a cannonball shape.

The light incident surface 162 of the lens 160 may correspond to the lower surface of the second part 220, and the light emitting surface 164 of the lens 160 may include the outer circumferential surface of the first part 210 and the outer circumferential surface of the second part 220.

As will be described later, in order to suppress generation of side beams, the diameter 2r of the lens may be greater than the height H of the lens 160 (2r>H).

Hereinafter, the height of the lens 160 may be a distance from the light incident surface 162 to the highest point of the light emitting surface 164 of the lens 160, and the diameter of the lens 160 may mean the diameter of the light incident surface 162 of the lens 160.

Figure 4:
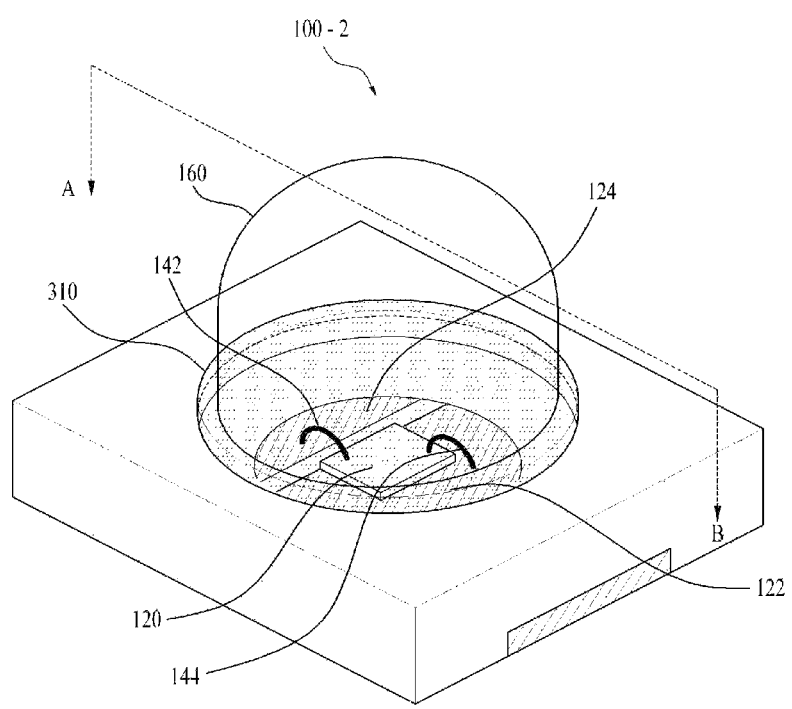
FIG. 4 is a perspective view of a light emitting element package in accordance with a second embodiment.
Figure 5:
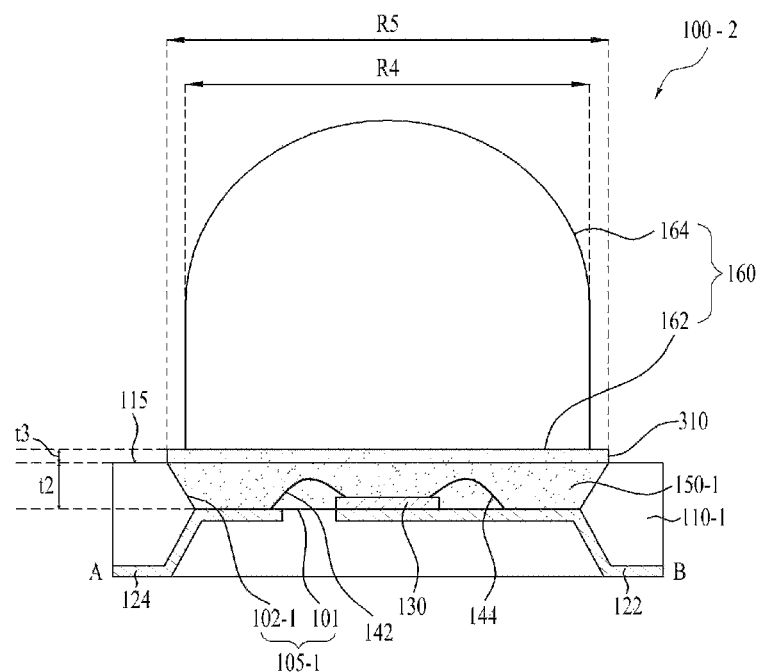
FIG. 5 is a cross-sectional view taken along line A-B of the light emitting element package shown in FIG. 4.

FIG. 4 is a perspective view of a light emitting element package 100-2 in accordance with a second embodiment, and FIG. 5 is a cross-sectional view taken along line A-B of the light emitting element package 100-2 shown in FIG. 4.

Some parts in this embodiment, which are substantially the same as those in the embodiment shown in FIGS. 1 and 2, are denoted by the same reference numerals even though they are depicted in different drawings and a detailed description thereof will thus be simplified or omitted because it is considered to be unnecessary.

With reference to FIGS. 4 and 5, the light emitting element package 100-2 includes a body 110-1, a first lead frame 122, a second lead frame 124, a light emitting element 130, wires 142, 144, a first molding part 150-1, a second molding part 310, and a lens 160.

The upper surface of the body 110 may be opened, and the body 110 may have a cavity 105-1 including a bottom 101 and a side surface 102-1. The side surface 102 of the cavity 105-1 may be vertical to or inclined to the bottom 101.

The depth t2 of the cavity 105-1 may be 100 μm~5 mm.

If the depth t2 of the cavity 105-1 is less than 100 μm, the wires 142, 144 may be exposed to the outside of the molding part 150-1 and thus contact a light incident surface 162 of the lens 160 and, if the light emitting element 130 is a flip-chip type, the light emitting element may be pressed.

Further, if the depth t2 of the cavity 105-1 exceeds 5 mm, a large amount of a resin fills the cavity 105-1 and, when the lens 160 is attached to the resin, a movement amount of the resin is increased, a movement path of the resin is increased and thus a large amount of bubbles may be formed in the first molding part 150-1.

For example, the depth of the cavity 105-1 may be a distance from the upper surface 115 of the body 110-1 to the bottom 101 of the cavity 105-1.

Differently from the side surface 102 of the cavity 105 shown in FIG. 2, the side surface of the cavity 105-1 shown in FIG. 5 has no staircase part.

The first molding part 150-1 may fill the cavity 105-1 so as to seal the light emitting element 130. The upper surface of the first molding part 150-1 may be flat, be parallel to the upper surface 115 of the body 110-1, and be located coplanar with the upper surface 115 of the body 110-1.

The second molding part 310 may be disposed on the first molding part 150-1, and the upper surface of the second molding part 310 may be located higher than the upper surface 115 of the body 110-1 based on the bottom surface of the body 110 or the upper surfaces of the first and second lead frames 122, 124.

The upper surface of the second molding part 310 may be flat, and the thickness t3 of the second molding part 310 may be 200 μm or less.

If the thickness t3 of the second molding part 310 exceeds 200 μm, the height of the lens 160 is increased and thus an orientation angle may be changed and the lens 160 may be inclined.

The first molding part 150-1 and the second molding part 310 may be formed of the same material as the molding part 150 described above with reference to FIGS. 1 and 2.

The lens 160 may be disposed on the second molding part 310, and a light incident surface 162 of the lens 160 may be attached to the second molding part 310. For example, the light incident surface 162 of the lens 160 may contact the second molding part 310.

The first molding part 150-1 may be formed by filling the cavity 105-1 with a first resin (for example, silicone) and hardening the first resin. The lens 160 may be attached to the first molding part 150 by applying a second resin to the first molding part 150-1, placing the lens 160 on the second resin prior to hardening of the second resin, and then hardening the second resin.

The diameter R4 of the light incident surface 162 of the lens 160 may be less than the maximum diameter R5 of the cavity 105-1. For example, the diameter R4 of the light incident surface 162 of the lens 160 may be less than the diameter of the uppermost end of the cavity 105-1.

In general, as the depth of a cavity filled with a molding part increases, a movement amount of the resin is increased and a movement path of the resin is increased when a lens is attached to the molding part and, thus, air movement within the resin is not easy and a large amount of bubbles may be formed in the molding part.

In the embodiment, since the lens 160 is attached to the second molding part 310 formed on the first molding part 150-1, the depth t2 of the cavity 105-1 may be decreased and thereby formation of bubbles in the first molding part 150-1 may be suppressed.

Figure 6:
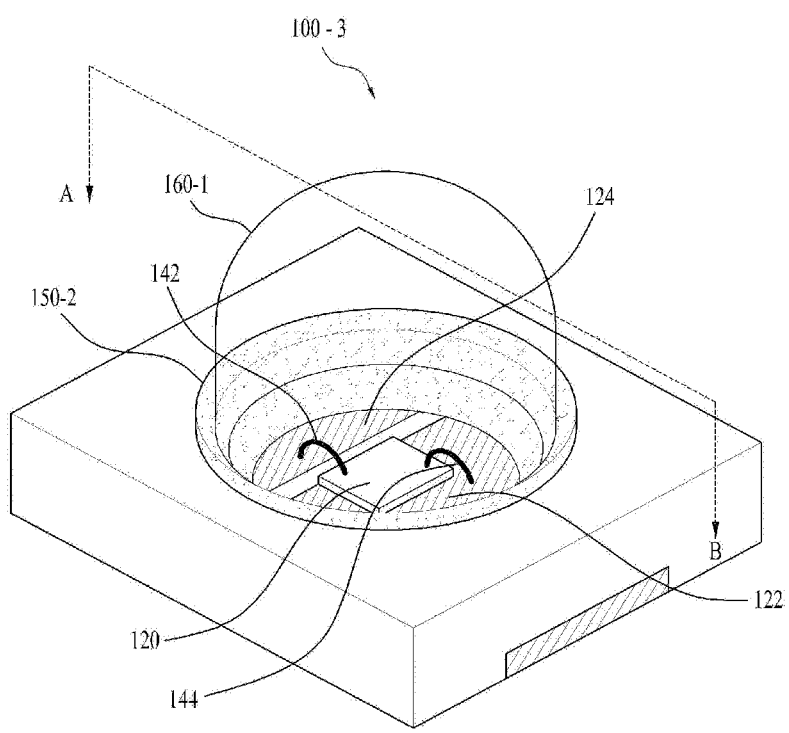
FIG. 6 is a perspective view of a light emitting element package in accordance with a third embodiment.
Figure 7:
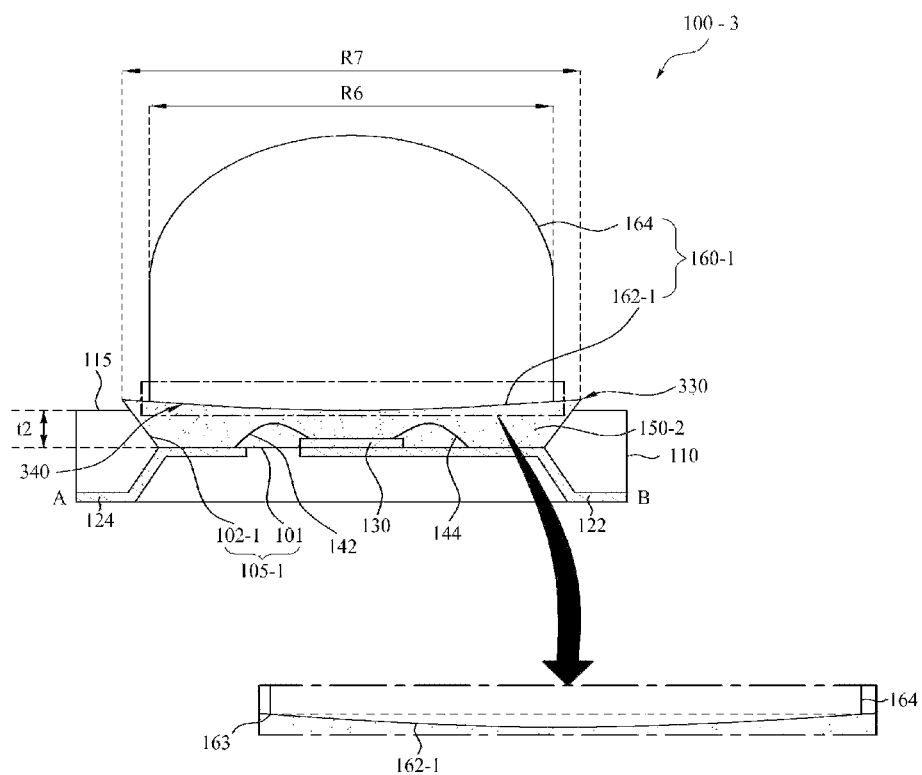
FIG. 7 is a cross-sectional view taken along line A-B of the light emitting element package shown in FIG. 6.

FIG. 6 is a perspective view of a light emitting element package 100-3 in accordance with a third embodiment, FIG. 7 is a cross-sectional view taken along line A-B of the light emitting element package shown in FIG. 6.

Some parts in this embodiment, which are substantially the same as those in the embodiment shown in FIGS. 5 and 6, are denoted by the same reference numerals even though they are depicted in different drawings and a detailed description thereof will thus be simplified or omitted because it is considered to be unnecessary.

With reference to FIGS. 6 and 7, the light emitting element package 100-3 includes a body 110-1, a first lead frame 122, a second lead frame 124, a light emitting element 130, wires 142, 144, a molding part 150-2, and a lens 160-1.

The molding part 150-2 is disposed in a cavity 105-1, and the lens 160-1 is disposed on the molding part 150-2.

The lens 160-1 may have the same structure as the lens 160 described with reference to FIG. 3 except for a light incident surface 162-1. The light incident surface 162-1 of the lens 160-1 may be a convex surface. The upper surface of the molding part 150-2 may be a concave surface contacting the light incident surface of the lens 160.

The curvature of the light incident surface 162-1 of the lens 160-1 may vary according to the diameter of the lens 160-1. For example, the curvature of the light incident surface 162-1 of the lens 160-1 may be equal to the curvature of a circle having a radius of 200 μm or less.

Attachment of the lens 160-1 to the molding part 150-2 will be carried out as below.

A resin (for example, silicone) fills the cavity 105-1. For example, the resin filling the cavity 105-1 may have a convex shape having the protruding central portion. Such a shape allows the resin to be spread so as to easily discharge air, when the lens 160-1 is attached to the resin.

Thereafter, the lens 160-1 is disposed on the resin prior to hardening of the resin, and then the resin is hardened, thereby being capable of attaching the lens 160-1 to the molding part 150-2.

In the embodiment, since the light incident surface 162-1 of the lens 160-1 is a convex surface having the protruding central portion, when the light incident surface 162-1 of the lens 160-1 is attached to the resin, the resin is spread from the central portion to the edge of the cavity 105-1 and thus air in the cavity 105-1 may be easily discharged to the outside of the cavity 105-1, thereby being capable of suppressing formation of bubbles in the molding part 150-2.

Further, an interface 340 between the light incident surface 162-1 of the lens 160-1 and the molding part 150-2 may be a concave surface having the same curvature as the light incident surface 162-1.

Further, since, when the light incident surface 162-1 of the lens 160-1 is attached to the resin, the resin is pushed from the central portion to the edge of the cavity 105-1, an upper end 330 of the edge of the molding part 150-2 may be located higher than the light incident surface 162-1 of the lens 160-2 based on the bottom 101 of the cavity 105-1 or the upper surfaces of the first and second lead frames 122, 124.

For example, the upper end 330 of the edge of the molding part 150-2 may be higher than the central portion, for example, the center having the lowest height, of the light incident surface 162-1 of the lens 160-1.

For example, the upper end 330 of the edge of the molding part 150-2 may protrude to a gap between the side surface 102-1 of the cavity 105-1 and the lower end of a light emitting surface 164 of the lens 160-1, and the protruding upper end 330 of the edge of the molding part 150-2 may be located higher than the upper surface 115 of the body 110 and the light incident surface 162-1 of the lens 160-1.

Figure 8:
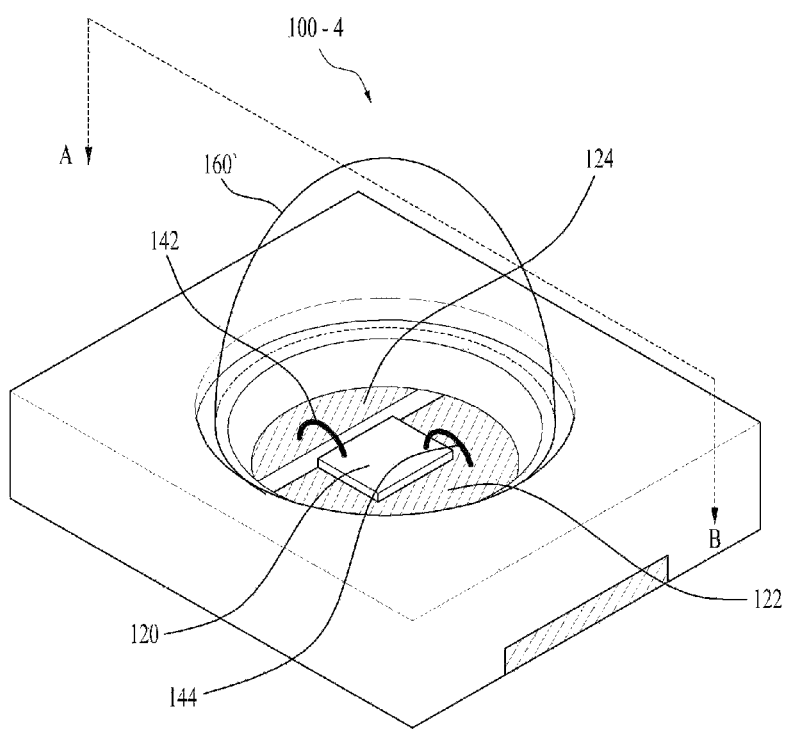
FIG. 8 is a perspective view of a light emitting element package in accordance with a fourth embodiment.
Figure 9:
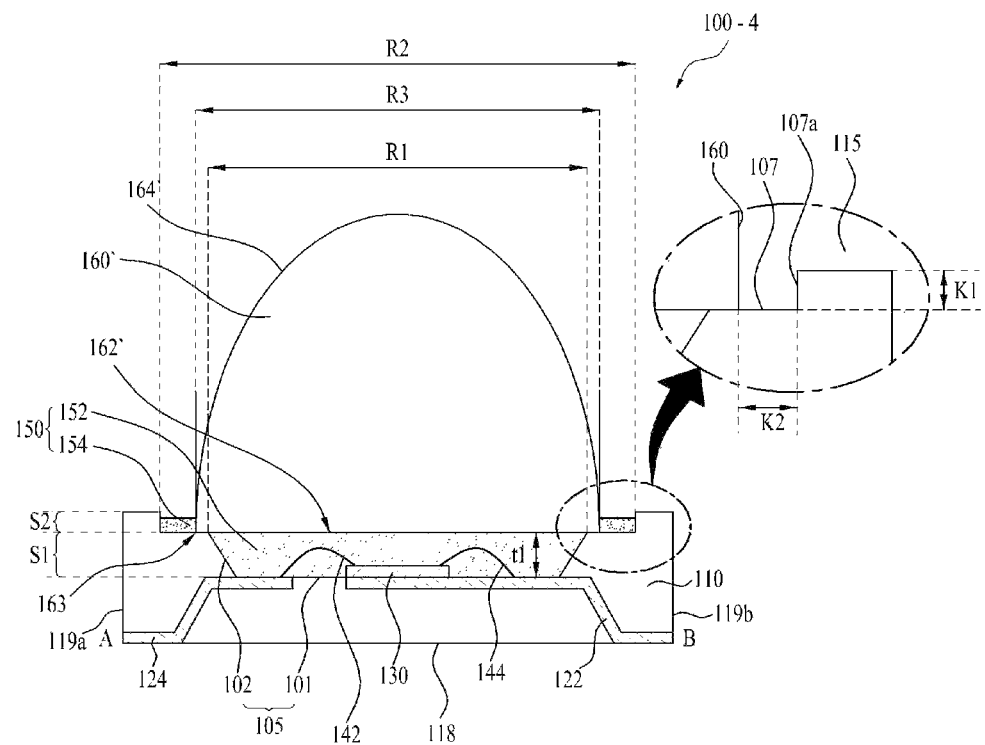
FIG. 9 is a cross-sectional view taken along line A-B of the light emitting element package shown in FIG. 8.
Figure 10:
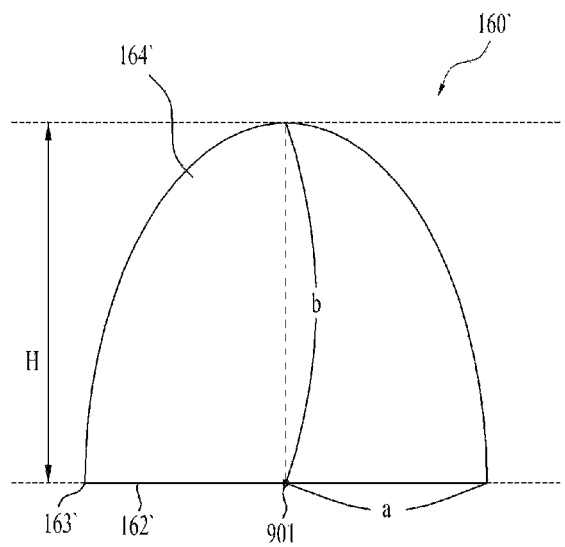
FIG. 10 is a cross-sectional view of a lens shown in FIG. 8.

FIG. 8 is a perspective view of a light emitting element package 100-4 in accordance with a fourth embodiment, FIG. 9 is a cross-sectional view taken along line A-B of the light emitting element package 100-4 shown in FIG. 8, and FIG. 10 is a cross-sectional view of a lens 160' shown in FIG. 8.

Some parts in this embodiment, which are substantially the same as those in the embodiment shown in FIGS. 1 and 2, are denoted by the same reference numerals even though they are depicted in different drawings and a detailed description thereof will thus be simplified or omitted because it is considered to be unnecessary.

With reference to FIGS. 8 to 10, the light emitting element package 100-4 in accordance with the fourth embodiment is a modification of the light emitting element package 100-1 in accordance with the first embodiment and thus elements of the light emitting element package 100-4 may be the same as those of the light emitting element package 100-1 except for the lens 160'.

The lens 160' in accordance with the fourth embodiment may include a light incident surface 162' upon which light having passed through the molding part 150 is incident, and a light emitting surface 164' which refracts and emits light having passed through the light incident surface 162'.

The light incident surface 162' may be flat, and the light emitting surface 164 may have a semi-elliptic cross-section. For example, the cross-section of the lens 160' which passes by a center 901 of the light incident surface 162' of the lens 160' and is vertical to the light incident surface 162' may have a semi-elliptic shape having a semi major axis b and a semi minor axis a. Here, the semi-elliptic shape may be a shape acquired by cutting an ellipse into halves.

As will be described later, in order to suppress generation of side beams, the diameter $2a$ of the lens 160' may be greater than the semi major axis b corresponding to the height H of the lens 169 ($2a > b$).

Figure 11:
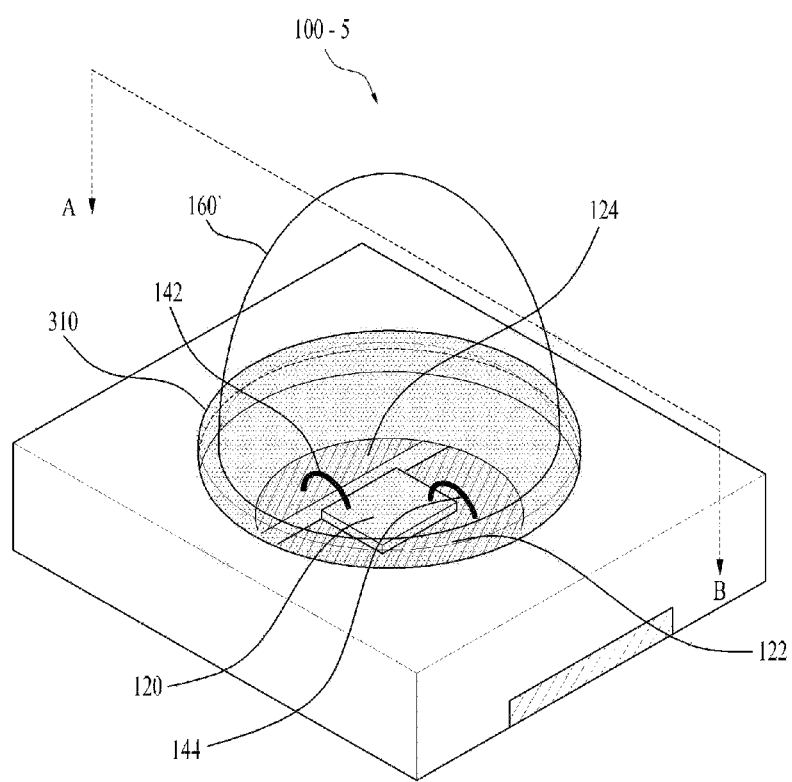
FIG. 11 is a perspective view of a light emitting element package in accordance with a sixth embodiment.
Figure 12:
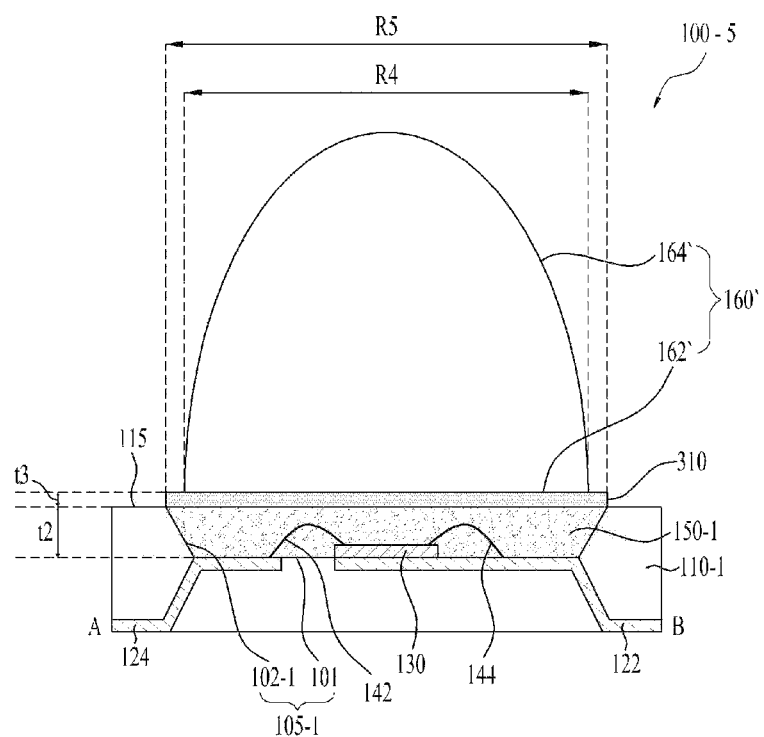
FIG. 12 is a cross-sectional view taken long line A-B of the light emitting element package shown in FIG. 11.

FIG. 11 is a perspective view of a light emitting element package 100-5 in accordance with a sixth embodiment and FIG. 12 is a cross-sectional view taken long line A-B of the light emitting element package 100-5 shown in FIG. 11.

Some parts in this embodiment, which are substantially the same as those in the embodiment shown in FIGS. 4 and 5, are denoted by the same reference numerals even though they are depicted in different drawings and a detailed description thereof will thus be simplified or omitted because it is considered to be unnecessary.

With reference to FIGS. 11 and 12, the light emitting element package 100-5 in accordance with the fifth embodiment is a modification of the light emitting element package 100-2 in accordance with the second embodiment and thus elements of the light emitting element package 100-5 may be the same as those of the light emitting element package 100-2 except for a lens 160'.

Figure 13:
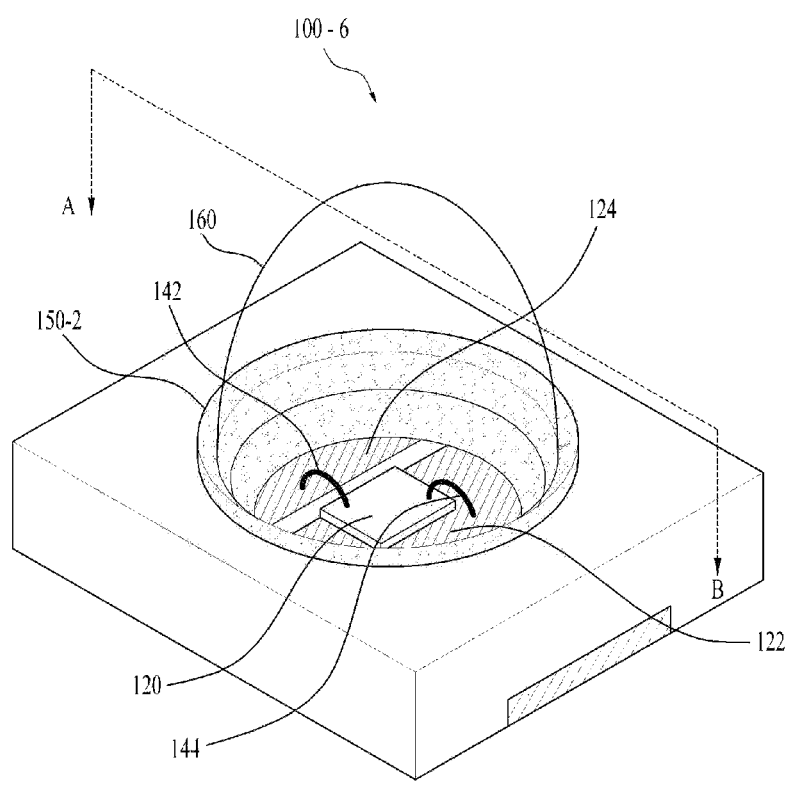
FIG. 13 is a perspective view of a light emitting element package in accordance with a sixth embodiment.
Figure 14:
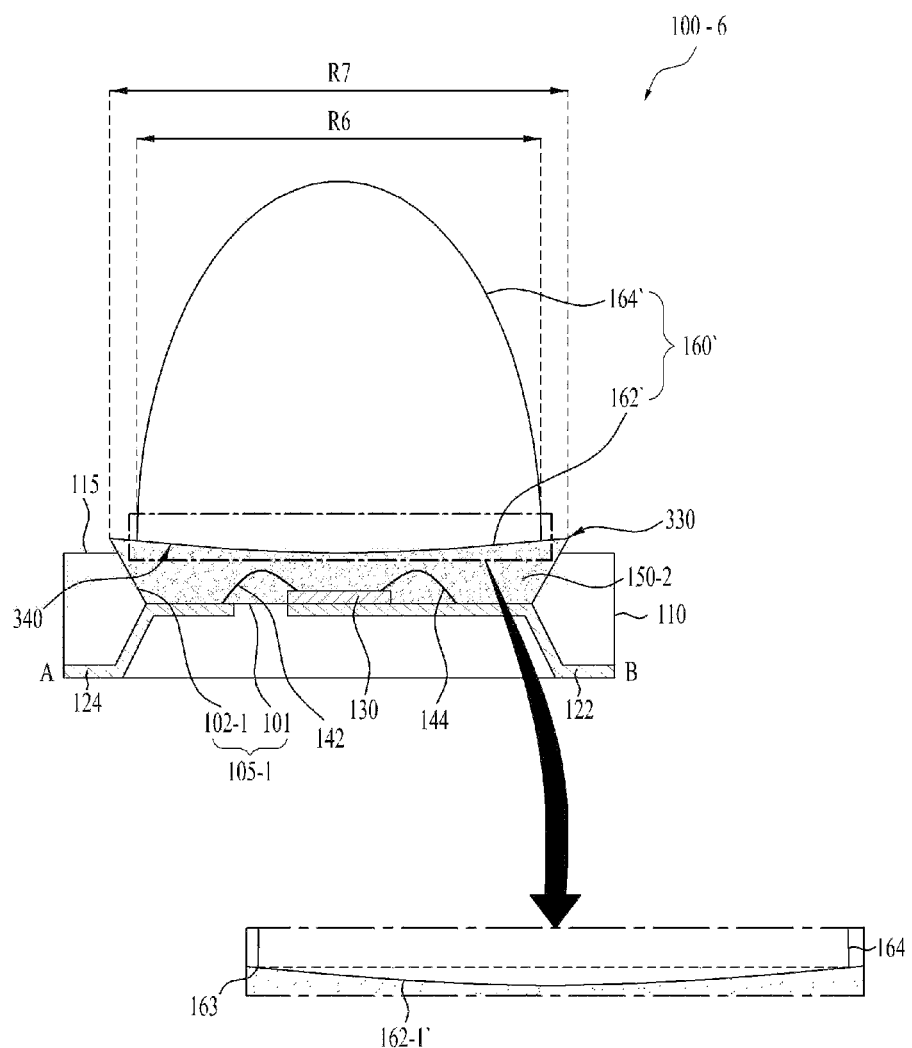
FIG. 14 is a cross-sectional view taken long line A-B of the light emitting element package shown in FIG. 13.

FIG. 13 is a perspective view of a light emitting element package 100-6 in accordance with a sixth embodiment and FIG. 14 is a cross-sectional view taken long line A-B of the light emitting element package 100-6 shown in FIG. 13.

Some parts in this embodiment, which are substantially the same as those in the embodiment shown in FIGS. 6 and 7, are denoted by the same reference numerals even though they are depicted in different drawings and a detailed description thereof will thus be simplified or omitted because it is considered to be unnecessary.

With reference to FIGS. 13 and 14, the light emitting element package 100-6 in accordance with the sixth embodiment is a modification of the light emitting element package 100-3 in accordance with the third embodiment and thus elements of the light emitting element package 100-6 may be the same as those of the light emitting element package 100-3 except for a lens 160'.

FIG. 15 is a table showing orientation angle characteristics of the light emitting element package 100-3 of the third embodiment according to change of the depth t2 of the cavity 105-1. Here, h=0 mm, i.e., the second part 220 of the lens 160 is omitted, the radius r of the first part 210 of the lens 160 may be 1.3 mm, 1.35 mm, or 1.4 mm.

With reference to FIG. 15, it may be understood that, as the depth t2 of the cavity 105-1 is increased, the orientation angle is reduced and light output Po is lowered. It may be understood that change of the orientation angle according to change of the radius r of the first part 210 of the lens 140 is not great.

FIG. 16 is a table showing orientation angle characteristics of the light emitting element package 100-3 of the third embodiment according to change of the diameter of the lens 160.

With reference to FIG. 16, it may be understood that change of the orientation angle according to change of the diameter of the first part 210 of the lens 140 is small. That is, it may be understood that, if the height h of the second part 220 of the lens 160 is the same, change of the orientation angle according to change of the radius r of the first part 210 of the lens 160 is small, but side beams are reduced.

It may be understood that, as the height h of the second part 220 of the lens 160 is increased, side beams are increased.

FIG. 17 is a table showing change of orientation angles and side beams according to the heights of the lenses 160 and 160' of the light emitting element packages 100-3 and 100-6 of the third embodiment and the sixth embodiment.

The radius r of the first part 210 of the lens 160 and the semi minor axis a of the lens 160' may have a predetermined value (for example, 1.3 mm). For example, the diameter 2×r of the lens 160 and the diameter 2×a of the lens 160' may be 2.6 mm.

With reference to FIG. 17, it may be confirmed that, as the height H of the lens 160 in accordance with the third embodiment is increased, the orientation angle is decreased and side beams are increased.

It may be confirmed that, when the diameter 2×r of the lens 160 is greater than the height H of the lens 160, there are few side beams. It may be confirmed that, when the diameter 2×r of the lens 160 is the same the height H of the lens 160, side beams appear.

Further, it may be confirmed that, as the height H of the lens 160 is greater than the diameter 2×r of the lens 160 and the height H of the lens 160 is increased, side beams are increased.

In this embodiment, side beams may be suppressed or removed by setting the diameter 2×r of the lens 160 to be greater than the height H of the lens 160.

Further, it may be confirmed that, as the semi major axis b of the lens 160' in accordance with the sixth embodiment is increased, the orientation angle is decreased and side beams are increased.

It may be confirmed that, when the diameter 2×a of the lens 160' is greater than the semi major axis b of the lens 160', there are few side beams. It may be confirmed that, when the diameter 2×a of the lens 160' is the same the semi major axis b of the lens 160', side beams appear.

Further, it may be confirmed that, as the semi major axis b of the lens 160' is greater than the diameter 2×a of the lens 160' and the semi major axis b of the lens 160' is increased, side beams are increased.

In this embodiment, side beams may be suppressed or removed by setting the diameter 2×a of the lens 160' to be greater than the semi major axis b of the lens 160'.

Figure 18:
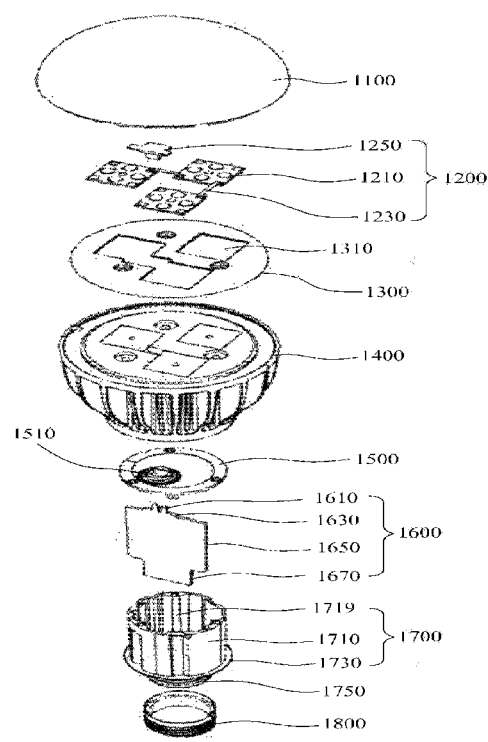
FIG. 18 is a view illustrating a lighting apparatus including light emitting element packages in accordance with one embodiment.

FIG. 18 is a view illustrating a lighting apparatus including light emitting element packages in accordance with one embodiment.

With reference to FIG. 18, the lighting apparatus may include a cover 1100, a light source module 1200, a heat sink 1400, a power supply unit 1600, an inner case 1700, and a socket 1800. Further, the light apparatus in accordance with this embodiment may further include at least one of a member 1300 and a holder 1500.

The cover 1100 may have a bulb or hemispheric shape which is hollow and is provided with one opened part. The cover 1100 may be optically combined with the light source module 1200. For example, the cover 1100 may diffuse, scatter, or excite light supplied from the light source module 1200. The cover 1100 may be a kind of optical member. The cover 1100 may be combined with the heat sink 1400. The cover 1100 may have a coupling part to be coupled with the heat sink 1400.

The inner surface of the cover 1100 may be coated with a milk-white paint. The milk-white paint may include a light diffuser to diffuse light. Surface roughness of the inner surface of the cover 1100 may be greater than surface roughness of the outer surface of the cover 1100. This serves to sufficiently scatter and diffuse light emitted from the light source module 1200 and to discharge the light to the outside.

The cover 1100 may be formed of glass, plastic, polypropylene (PP), polyethylene (PE), polycarbonate (PC), etc. Here, polycarbonate (PC) has excellent light resistance, heat resistance, and strength. Although the cover 1100 may be transparent so that the light source module 1200 is visible from the outside, the disclosure is not limited thereto and the cover 110 may be opaque. The cover 1100 may be formed by blow molding.

The light source module 1200 may be disposed on one surface of the heat sink 1400. Therefore, heat generated from the light source module 1200 is conducted to the heat sink 1400. The light source module 1200 may include light source units 1210, connection plates 1230, and a connector 1250.

The light source unit 1210 may be any one of the light emitting element packages 100-1 to 100-6 in accordance with the above-described embodiments.

The member 1300 may be disposed on the upper surface of the heat sink 1400, and include guide holes 1310 into which the light source units 1210 and the connector 1250 are inserted. The guide holes 1310 may correspond to or be aligned with substrates of the light source units 1210 and the connector 1250.

A light reflecting material may be applied to or coated on the surface of the member 1300.

For example, a white paint may be applied to or coated on the surface of the member 1300. The member 1300 reflects light, reflected by the inner surface of the cover 1100 and returning toward the light source module 1200, to the cover 1100. Therefore, the member 1300 may enhance luminous efficacy of the lighting apparatus in accordance with this embodiment.

The member 1300 may be formed of, for example, an insulating material. The connection plates 1230 of the light source module 1200 may include an electrically conductive material. Therefore, electrical contact between the heat sink 1400 and the connection plates 1230 may be carried out. The member 1300 formed of an insulating material may prevent electrical short circuit between the connection plates 1230 and the heat sink 1400. The heat sink 1400 receives heat from the light source module 1200 and heat from the power supply unit 1600, and dissipates the heat.

The holder 1500 closes a reception hole 1719 of an insulating part 1710 of the inner case 1700. Therefore, the power supply unit 1600 received in the insulating part 1710 of the inner case 1700 is sealed. The holder 1500 may have a guide protrusion 1510, and the guide protrusion 1510 may be provided with a hole through which protrusions 1610 of the power supply unit 1600 pass.

The power supply unit 1600 processes or converts an electrical signal provided from the outside, and then supplies the processed or converted electrical signal to the light source module 1200. The power supply unit 1600 may be received in the reception hole 1719 of the inner case 1700 and be sealed within the inner case 1700 by the holder 1500. The power supply unit 1600 may include the protrusions 1610, a guide part 1630, a base 1650, and an extension 1670.

The guide part 1630 may protrude from one side of the base 1650 to the outside. The guide part 1630 may be inserted into the holder 1500. A plurality of elements may be disposed on one surface of the base 1650. For example, the elements may include an AC/DC converter to convert AC power supplied from an external power source into DC power, a drive chip to control driving of the light source module 1200, and an ElectroStatic discharge (ESD) protection element to protect the light source module 1200, without being limited thereto.

The extension 1670 may protrude from the other side of the base 1650 to the outside. The extension 1670 may be inserted into a connection part 1750 of the inner case 1700 and receive an electrical signal provided from the outside. For example, the extension 1670 may have a width equal to or less than the width of the connection part 1750 of the inner case 1700.

One end of each of a positive (+) electric wire and a negative (−) electric wire may be conductibly connected to the extension 1670, and the other end of each of the positive (+) electric wire and the negative (−) electric wire may be conductibly connected to the socket 1800.

The inner case 1700 may include a molding part in addition to the power supply unit 1600 therein. The molding part is formed by hardening a molding liquid and serves to fix the power supply unit 1600 within the inner case 1700.

Figure 19:
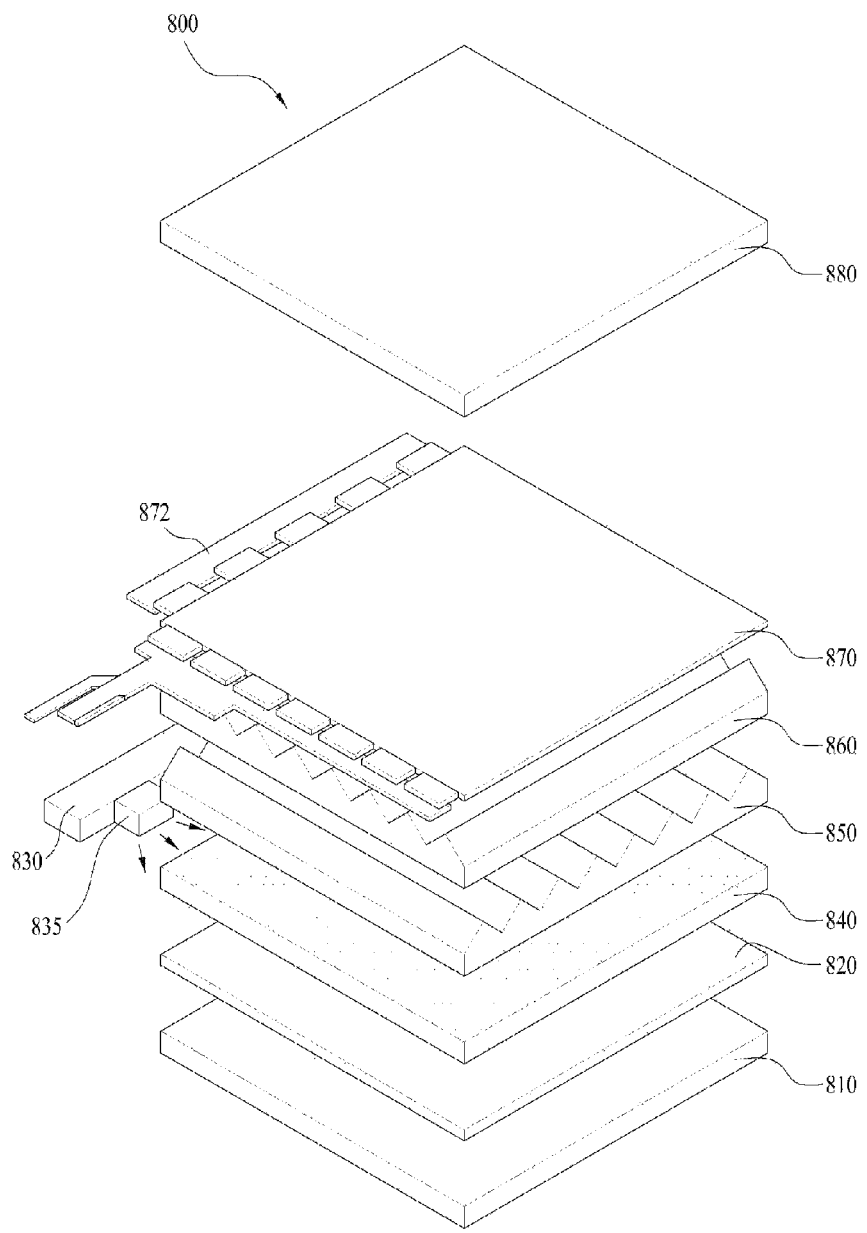
FIG. 19 is a view illustrating a display apparatus including light emitting element packages in accordance with one embodiment.

FIG. 19 is a view illustrating a display apparatus including light emitting element packages in accordance with one embodiment.

With reference to FIG. 19, the display apparatus 800 may include a bottom cover 810, a reflective plate 820 disposed on the bottom cover 810, a light emitting module 830, 835 to emit light, a light guide panel 840 disposed in front of the reflective plate 820 and guiding light emitted from the light emitting module 830, 835 in the forward direction of the display apparatus, optical sheets including prism sheets 850, 860 disposed in front of the light guide panel 840, a display panel 870 disposed in front of the optical sheets, an image signal output circuit 872 connected to the display panel 870 and supplying an image signal to the display panel 870, and a color filter 880 disposed in front of the display panel 870. Here, the bottom cover 810, the reflective plate 820, the light emitting module 830, 835, the light guide panel 840 and the optical sheets may form a backlight unit.

The light emitting module may include light emitting element packages 835 mounted on a substrate 830. Here, a PCB may be used as the substrate 830. The light emitting element package 835 may be any one of the light emitting element packages 100-1 to 100-6 in accordance with the above-described embodiments.

The bottom cover 810 may receive elements within the display apparatus 800. The reflective plate 820 may be separately provided, as exemplarily shown in this figure, or be provided by coating the rear surface of the light guide panel 840 or the front surface of the bottom cover 810 with a material having high reflectivity.

Here, the reflective plate 820 may be formed of a material which has high reflectivity and is capable of forming an ultra-thin thickness, and be formed of PolyEthylene Terephthalate (PET).

The light guide panel 830 may be formed of PolyMethylMethAcrylate (PMMA), PolyCarbonate (PC), or PolyEthylene (PE).

The first prism sheet 850 is formed by applying a light-transmitting and elastic polymer to one surface of a support film, and the polymer may have a prism layer in which a plurality of 3D structures is repeated. Here, the structures may be provided in a stripe pattern in which projections and depressions are repeated, as shown in this figure.

The direction of projections and depressions formed on one surface of a support film of the second prism sheet 860 may be perpendicular to the direction of the projections and the depressions formed on one surface of the support film of the first prism sheet 850. This serves to uniformly disperse light transmitted from the light emitting module and the reflective sheet in all directions of the display panel 1870.

Although not shown in the drawings, a diffusion sheet may be disposed between the light guide panel 840 and the first prism sheet 850. The diffusion sheet may be formed of a polyester or polycarbonate-based material and maximally increase the projection angle of light incident from the backlight unit through refraction and scattering. Further, the diffusion sheet may include a support layer including a light diffuser, and a first layer and a second layer formed on a light emitting surface (a surface toward the first prism sheet) and a light incident surface (a surface toward the reflective sheet) and including no light diffuser.

Although, in this embodiment, the diffusion sheet, the first prism sheet 850 and the second prism sheet 860 are used as the optical sheets, the optical sheets may include other combinations, for example, a micro-lens array, a combination of a diffusion sheet and a micro-lens array, or a combination of one prism sheet and a micro-lens array.

As the display panel 870, a liquid crystal display panel may be provided. Further, in addition to the liquid crystal display panel, other kinds of display devices requiring light sources may be provided.

Figure 20:
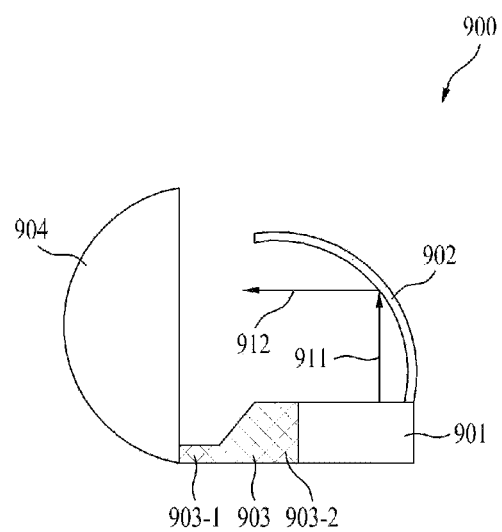
FIG. 20 is a view illustrating a head lamp including light emitting element packages in accordance with one embodiment.

FIG. 20 is a view illustrating a head lamp 900 including light emitting element packages in accordance with one embodiment. With reference to FIG. 20, the head lamp 900 includes a light emitting module 901, a reflector 902, a shade 903, and a lens 904.

The light emitting module 901 may include a plurality of light emitting element packages (not shown) disposed on a substrate (not shown). Here, the light emitting element package may be any one of the light emitting element packages 100-1 to 100-6 in accordance with the above-described embodiments.

The reflector 902 reflects light 911, emitted from the light emitting module 901, in a designated direction, for example, in the forward direction 912.

The shade 903 is a member which is disposed between the reflector 902 and the lens 904 and intercepts or reflects a part of light reflected by the reflector 902 and directed to the lens 904 so as to form a light distribution pattern desired by a designer, and one side part 903-1 and the other side part 903-2 of the shade 903 may have different heights.

Light emitted from the light emitting module 901 may be reflected by the reflector 902 and the shade 903, pass through the lens 904, and travel in the forward direction of a vehicle frame. The lens 904 may refract light, reflected by the reflector 902, toward the front.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

Embodiments are applicable to a lighting apparatus and a display apparatus.

The invention claimed is:

1. A light emitting element package comprising:
a body having a cavity including a bottom and a side surface;
a light emitting element disposed in the cavity of the body;
a molding part disposed in the cavity so as to seal the light emitting element; and
a lens including a light incident surface and a light emitting surface and disposed on the molding part, wherein:
the cavity includes:
a staircase part disposed at an upper end of the side surface of the cavity, the staircase having a height difference with an upper surface of the body and being parallel to the upper surface of the body; and
a staircase surface disposed between the upper surface of the body and the staircase part,
wherein an edge of the light incident surface of the lens contacts the staircase part,
wherein a distance from an outer circumferential surface of the lens located on the staircase part to the staircase surface is greater than a height difference between an upper surface of the cavity and the staircase part.

2. The light emitting element package according to claim 1, wherein
a diameter of the light incident surface of the lens is less than the maximum diameter of the cavity; and a height of the lens is less than the diameter of the light incident surface of the lens.

3. The light emitting element package according to claim 2, wherein:
the cavity includes a first region located under the staircase part and a second region located on the staircase part; and the diameter of the light incident surface of the lens is less than a diameter of the second region of the cavity and is greater than a diameter of the first region of the cavity.

4. The light emitting element package according to claim 3, wherein the diameter of the second region of the cavity is greater than the maximum diameter of the first region of the cavity.

5. The light emitting element package according to claim 3, wherein a separation distance between the side surface of the second region of the cavity and a boundary line between the edge of the light incident surface and the lowermost end of the light emitting surface of the lens is greater than the height difference.

6. The light emitting element package according to claim 3, wherein the molding part includes:
a first part disposed in the first region of the cavity and provided with an upper surface contacting the light incident surface of the lens; and
a second part disposed between a lower end of the light emitting surface of the lens and the side surface of the cavity located in the second region of the cavity.

7. The light emitting element package according to claim 6, wherein the second part of the molding part respectively contacts the lower end of the light emitting surface of the lens and the side surface of the cavity located in the second region of the cavity.

8. The light emitting element package according to claim 7, wherein an upper surface of the second part of the molding part is located below the upper surface of the body.

9. The light emitting element package according to claim 2, wherein a boundary line between the edge of the light incident surface and the lowermost end of the light emitting surface of the lens contacts the staircase part and overlaps with the staircase part in a vertical direction.

10. The light emitting element package according to claim 1, wherein the lens includes:
a first part having a hemispherical shape; and
a second part located under the first part and having a cylindrical shape with the same radius as the first part,
wherein a lower surface of the second part corresponds to the light incident surface of the lens, and an outer circumferential surface of the first part and an outer circumferential surface of the second part correspond to the light emitting surface of the lens.

11. The light emitting element package according to claim 10, wherein:
a diameter of the lens is greater than a height of the lens; and
the diameter of the lens is the diameter of the light incident surface of the lens, and the height of the lens is a distance from the light incident surface of the lens to the highest point of the light emitting surface of the lens.

12. The light emitting element package according to claim 1, wherein a cross-section of the lens passing by a center of the light incident surface of the lens and being vertical to the light incident surface has a semi-elliptic shape.

13. The light emitting element package according to claim 12, wherein:
a diameter of the lens is greater than a height of the lens; and
the diameter of the lens is the diameter of the light incident surface of the lens, and the height of the lens is a distance from the light incident surface of the lens to the highest point of the light emitting surface of the lens.

14. A light emitting element package comprising:
a body having a cavity including a bottom and a side surface;
a light emitting element disposed in the cavity of the body;
a molding part configured to seal the light emitting element; and
a lens including a light incident surface and a light emitting surface and disposed on the molding part, wherein:
a diameter of the light incident surface of the lens is less than the maximum diameter of the cavity, and a height of the lens is less than the diameter of the light incident surface of the lens;
the molding part includes:
a first molding part filling the cavity to seal the light emitting element; and
a second molding part disposed on the first molding part; and
the lens is disposed on the second molding part and the light incident surface of the lens contacts the second molding part,
wherein an upper surface of the first molding part is coplanar with an upper surface of the body.

15. The light emitting element package according to claim 14, wherein an upper surface of the second molding part is located higher than the upper surface of the body.

16. A light emitting element package comprising:
a body having a cavity including a bottom and a side surface;
a light emitting element disposed in the cavity of the body;
a molding part configured to seal the light emitting element; and
a lens including a light incident surface and a light emitting surface and disposed on the molding part, wherein:
a diameter of the light incident surface of the lens is less than the maximum diameter of the cavity, and a height of the lens is less than the diameter of the light incident surface of the lens;
the light incident surface of the lens is a convex surface in a direction from the lens to the molding part; and
an interface between the light incident surface of the lens and the molding part is a concave surface in a direction from the lens to the molding part.

17. The light emitting element package according to claim 16, wherein an upper surface of the molding part is a concave surface in a direction from the lens to the molding part contacting the light incident surface of the lens.

18. The light emitting element package according to claim 16, wherein an upper end of an edge of the molding part is located higher than the upper surface of the body and the light incident surface of the lens.

19. The light emitting element package according to claim 16, wherein an upper end of an edge of the molding part is located higher than a central portion of the light incident surface of the lens.

20. The light emitting element package according to claim 16, wherein an upper end of an edge of the molding part protrudes to a gap between the side surface of the cavity and a lower end of the light emitting surface of the lens.

* * * * *